United States Patent
Shih et al.

(10) Patent No.: US 10,177,165 B1
(45) Date of Patent: Jan. 8, 2019

(54) METHOD FOR FABRICATING MERGING SEMICONDUCTOR INTEGRATED CIRCUIT

(71) Applicant: UNITED MICROELECTRONICS CORP., Hsinchu (TW)

(72) Inventors: Ping-Chia Shih, Tainan (TW); Chun-Yao Wang, Tainan (TW); Ming-Hua Tsai, New Taipei (TW); Wan-Chun Liao, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/641,560

(22) Filed: Jul. 5, 2017

(51) Int. Cl.
| | |
|---|---|
| *H01L 27/11573* | (2017.01) |
| *H01L 27/11568* | (2017.01) |
| *H01L 21/266* | (2006.01) |
| *H01L 21/28* | (2006.01) |
| *H01L 29/51* | (2006.01) |

(52) U.S. Cl.
CPC ...... *H01L 27/11573* (2013.01); *H01L 21/266* (2013.01); *H01L 21/28282* (2013.01); *H01L 27/11568* (2013.01); *H01L 29/513* (2013.01)

(58) Field of Classification Search
USPC .......................................................... 438/587
See application file for complete search history.

(56) References Cited

U.S. PATENT DOCUMENTS

| | | | |
|---|---|---|---|
| 6,262,455 B1 | 7/2001 | Lutze et al. | |
| 6,946,349 B1 | 9/2005 | Lee et al. | |
| 2012/0223418 A1* | 9/2012 | Stowers | C23C 18/06 257/632 |
| 2015/0069524 A1* | 3/2015 | Hong | H01L 27/1203 257/392 |
| 2016/0267979 A1* | 9/2016 | Hong | G11C 14/0063 |
| 2017/0053930 A1* | 2/2017 | Prinz | H01L 28/60 |

* cited by examiner

*Primary Examiner* — Moazzam Hossain
*Assistant Examiner* — Lawrence C Tynes, Jr.
(74) *Attorney, Agent, or Firm* — WPAT, PC

(57) ABSTRACT

A method for fabricating a semiconductor integrated circuit (IC) having a SONOS memory device and a logic/analog device requiring different gate oxide layers comprises steps as follows: A substrate having a high voltage region, a memory region and a logic/analog is firstly provided. Next, a first gate oxide layer is formed on the high voltage region, the memory region and the logic/analog. The first gate oxide layer is then patterned to expose the logic/analog region and to define a first channel area and a second channel area respectively on the memory region and the high voltage region. Subsequently, a silicon oxide-silicon nitride-silicon oxide (ONO) structure is formed on the first channel area. A second gate oxide layer is then formed on the logic/analog and patterned to define a third channel area.

9 Claims, 4 Drawing Sheets

METHOD FOR FABRICATING MERGING SEMICONDUCTOR INTEGRATED CIRCUIT

BACKGROUND

Field of the Invention

The invention relates in general to a method for fabricating a semiconductor integrated circuit (IC), and more particularly to a method for fabricating a merging semiconductor IC having a silicon/silicon oxide/silicon nitride/silicon oxide/silicon (SONOS) memory device and a logic/analog device.

Description of the Related Art

Merging semiconductor logic/analog devices, such as field effect transistors (FETs), with non-volatile memory devices, such as SONOS memory devices, is finding extensive use in the electronics industry. These embedded SONOS memory devices and FETs require different gate oxide thicknesses to optimize the FET performance. Typically non-volatile memory devices and peripheral input/output (I/O) devices (also referred to as high voltage devices) require thicker gate oxides, while logic/analog devices require a thinner gate oxide for increased performance (switching speed).

One conventional method of achieving dual-thickness gate oxides for FETs while forming a silicon oxide/silicon nitride/silicon oxide (ONO) layer on a substrate comprises steps as follows: Firstly, at least one insolation structure, such as a shallow trench (STI) isolation, is formed in the silicon substrate to electrically isolate various device areas, the logic/analog device region, the I/O region and the SONOS memory region. A stacked layer consists of a first silicon oxide (SiOx) layer, a silicon nitride (SiN) layer, and a top SiOx layer is formed and patterned to leave on the substrate to cover the SONOS memory region. Then, a first gate oxide layer and a second gate oxide layer are formed in sequence to respectively cover the logic/analog device region and the I/O region. Unfortunately, during the process for forming the first gate oxide layer and the second gate oxide layer, the effects of cleaning and oxidizing can dramatically alter the thickness of the top SiOx layer which could reduce the processing window of the ONO stacked layer and deteriorate the electric performance of the SONOS memory device.

Therefore, there is a need of providing a method for fabricating a merging semiconductor devices to obviate the drawbacks encountered from the prior art.

SUMMARY OF THE INVENTION

One aspect of the preset disclosure provides a method for fabricating a merging semiconductor IC having a SONOS memory device and a logic/analog device requiring different gate oxide layers, the method comprises steps as follows: A substrate having a high voltage region, a memory region and a logic/analog is firstly provided. Next, a first gate oxide layer is formed on the high voltage region, the memory region and the logic/analog. The first gate oxide layer is then patterned to expose the logic/analog region and to define a first channel area and a second channel area respectively on the memory region and the high voltage region.

Subsequently, a silicon oxide-silicon nitride-silicon oxide (ONO) structure is formed on the first channel area. A second gate oxide layer is formed on the logic/analog region to define a third channel area.

According to one embodiment of the present disclosure, a first gate oxide layer is firstly formed on a substrate surface covering on a high voltage region, a memory region and a logic/analog region is firstly provided. Next, a first gate oxide layer is formed on the high voltage region. The first gate oxide layer is then patterned to respectively define a first channel area for forming SONOS memory device on the memory region and a second channel area for forming a high voltage device on the high voltage region. Subsequently, an ONO structure is formed on the first channel area and a second gate oxide layer is formed on the logic/analog region to define a third channel area for forming a logic/analog device.

Since the first gate oxide layer for forming the high voltage device requires a dielectric constant substantially higher than that of the second gate oxide layer for forming a logic/analog device, thus the thickness of the first gate oxide layer and the thermal budget for forming the same may greater than that of the second gate oxide. By adjusting the processing sequences for fabricating the semiconductor IC to make the first gate oxide layer formed before the ONO structure of the SONOS memory device and the second gate oxide layer, the ONO structure can be prevented from being inversely affected by thermal impact resulted from the process for forming the first gate oxide layer which could deteriorate the electric performance of the SONOS memory device by reducing the top oxide layer thickness and processing window of the ONO structure. Such that the process yields and the performance of the semiconductor IC can be improved.

The above and other aspects of the disclosure will become better understood with regard to the following detailed description of the preferred but non-limiting embodiment(s). The following description is made with reference to the accompanying drawings.

DETAILED DESCRIPTION OF THE INVENTION

Figure 1A:
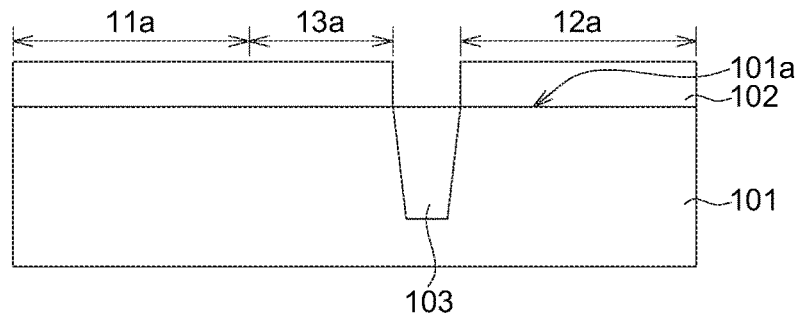
FIGS. 1A to 1H are cross-sectional views illustrating the processing structures for fabricating a merging semiconductor IC having a SONOS memory device and a logic/analog device requiring different gate oxide layers according to one embodiment of the present disclosure.

A number of embodiments of the present disclosure are disclosed below with reference to accompanying drawings. However, the structure and content disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the invention will be able to make suitable modifications or changes based on the specification disclosed below to meet actual needs without breaching the spirit of the invention. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

FIGS. 1A to 1H are cross-sectional views illustrating the processing structures for fabricating a merging semiconductor IC 100 having a SONOS memory device 11 and a logic/analog device 12 requiring different gate oxide layers according to one embodiment of the present disclosure. It should be noted that to more clearly illustrate the features and relationship between some elements of the merging semiconductor IC 100, some other elements may be omitted. The method for fabricating the merging semiconductor IC 100 includes steps as follows:

A substrate 101 is firstly provided, and a first gate oxide layer 102 is then formed on the substrate 101 (see FIG. 1A). In some embodiments of the preset disclosure, the substrate 101 can be a semiconductor substrate, such as a silicon wafer. In one embodiment, the substrate 101 is a bulk semiconductor substrate made of single-crystal silicon or poly-silicon. However, in some other embodiments, the substrate 101 can further include other layer, such as semiconductor layers consisting of semiconductor material other than silicon or insulating layers (not shown).

In some embodiments of the present disclosure, prior to the forming of the first gate oxide layer 102, at least one shallow trench (STI) isolation 103 may be formed in the substrate 101 to define at least one device region, such as at least one high voltage region 13a, at least one memory region 11a and at least one logic/analog region 12a, on the surface 101a of the substrate 101. For simplicity and purpose of discussion, merely three device areas are depicted adjacent to each other; however, it should be understood that the device regions can be distributed differently on the substrate depending upon the circuit design.

In some embodiments of the present disclosure, the first gate oxide layer 102 can be formed by a thermal oxidation process or a silicon oxide deposition process, such a low pressure chemical vapor deposition (LPCVD) process, performed on the surface 101a of the semiconductor substrate 101. The first gate oxide layer 102 may have a thickness ranging from 100 angstrom (Å) to 200 Å. In the present embodiment, the forming of the gate oxide layer 102 may include steps of performing an in-situ-steam-generation (ISSG) oxidation process on a surface of a poly-silicon wafer to form a silicon dioxide ($SiO_2$) layer with a thickness about 160 Å covering on the high voltage region 13a, the memory region 11a and the logic/analog region 12a.

Figure 1B:
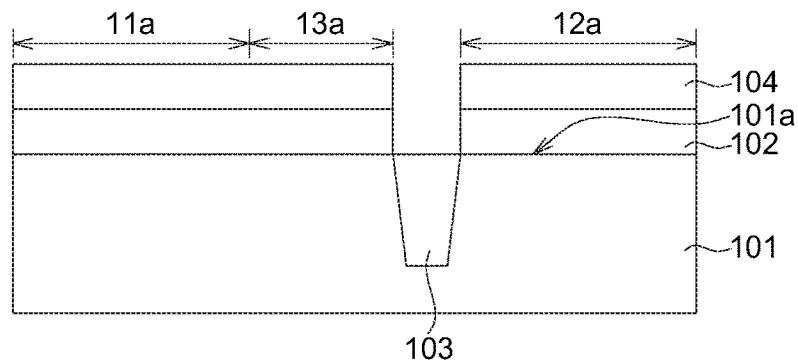
Figure 1C:
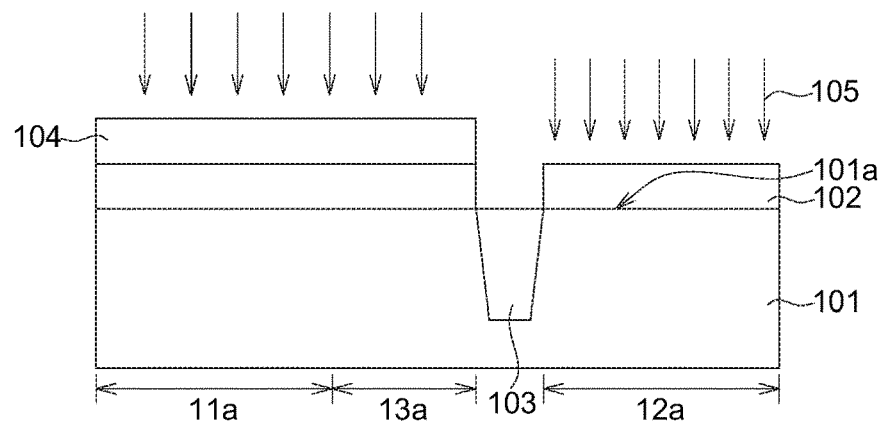
Figure 1D:
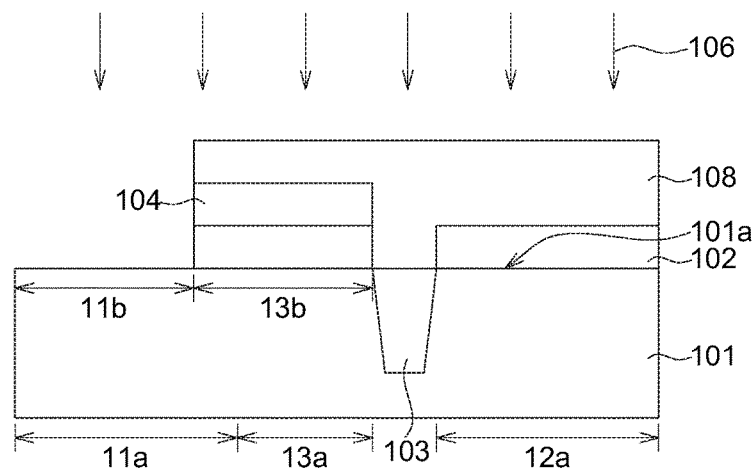

Next, a hard mask layer 104 is formed on the first gate oxide layer 102 (see FIG. 1B). In some embodiment of the present disclosure, the hard mask layer 104 can be a silicon nitride (SiN) layer formed by a PCVD process and having a thickness about 200 Å. At least one ion implantation 105 are then performed on the hard mask layer 104 to drive a plurality of dopants into the substrate to form a plurality wells and channels (not shown) in the substrate 101, especially in the logic/analog region 12a. In some embodiment of the present disclosure, the portion of the hard mask layer 104 covering on the logic/analog region 12a may be removed prior to the ion implantation 105 (see FIG. 10).

The first gate oxide layer 102 is then patterned by a first etching process 106 to expose a portion of the memory region 11a, so as to respectively define a first channel area 11b and a second channel area 13b on the memory region 11a and the high voltage region 13a. In some embodiments of the present disclosure, the first etching process 106a may be an anisotropic etching process, such as a reactive-ion etching (RIE) process or a plasma etching process, to partially remove portions of the first gate oxide layer 102 and the hard mask layer 104 covering on the memory region 11a (see FIG. 1D). In the present embodiment, the first channel area 11b includes the exposed portion of the substrate surface 101a defined by the remaining first gate layer 102 disposed in the memory region 11a; and the second channel area 13b includes the portion of the substrate surface 101a covered by the remaining first gate oxide layer 102 disposed in the high voltage region 13a.

In some embodiments of the present embodiments, a portion of the first gate oxide layer 102 and the hard mask layer 104 disposed on the memory region 11a may be covered by the etching mask 108 (such as a patterned photoresist layer) of the first etching process 106, thus portions of the first gate oxide layer 102 and the hard mask layer 104 disposed on the memory region 11a (that are covered by the etching mask 108) can be remained in the memory region 11a after the first etching process 106. In other words, the first channel area 11b defined by the remaining first gate oxide layer 102 may have a size substantially smaller than that of the memory region 11a. However, the first etching process 106 and the first channel area 11b are not limited to this regards, in some other embodiment, the first etching process 106 may thoroughly remove the portion of the first gate oxide layer 102 and the hard mask layer 104 disposed on the memory region 11a, and the first channel area 11b may thus have a size substantially equal to that of the memory region 11a.

Figure 1E:
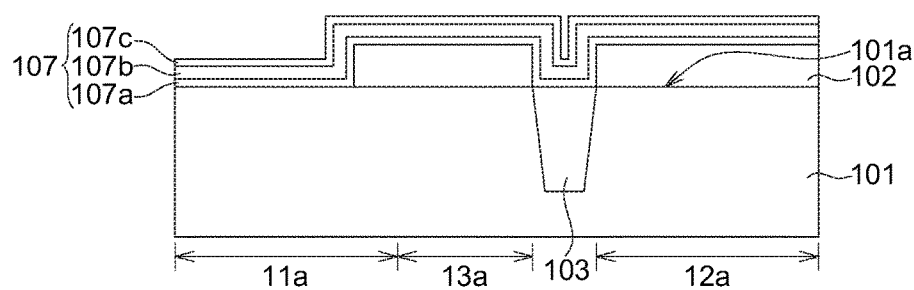

After the hard mask layer 104 is striped, an ONO structure 107 is formed on the memory region 11a to cover the first channel area 11b (see FIG. 1E). In some embodiments of the present disclosure, the forming of the ONO structure 107 including steps as follows: A composite layer 107 at least having an oxide-nitride-oxide (ONO)-stacked-layer structure is formed on the substrate 101 to cover the exposed portion of the memory region 11a (the first channel area 11b) and the remaining first gate oxide layer 102 (disposed on the logic/analog region 12a and the high voltage region 13a). In some embodiments, the composite layer 107 may include more ONO stacked-layers. For example, in some other embodiments, the composite layer 107 may include (but not limited to) an oxide-nitride-oxide-nitride-oxide (ONONO)-stacked-layer structure or an oxide-nitride-oxide-nitride-oxide-nitride-oxide (ONONONO)-stacked-layer structure.

In the present embodiment, the composite layer 107 is a stacked layer configured by a bottom $SiO_2$ layer 107a, a storage $Si_3N_4$ layer 107b, and a top $SiO_2$ layer 107c. The bottom $SiO_2$ layer 107a is formed by thermal oxidation using, for example, rapid thermal oxidation (RTO) or ISSG, having a thickness substantially ranging from 30 to 50 Å, and more specifically about 40 Å. The storage Si3N4 layer 107b is deposited on the bottom $SiO_2$ layer 107a by a LPCVD process using a reactant gas mixture of dichlorosilane and ammonia. The thickness of the storage Si3N4 layer 107b substantially ranges from 70 Å to 90 Å, and more specifically may be about 80 Å. The top $SiO_2$ layer 107c is formed on the storage $Si_3N_4$ layer 107b by a LPCVD process using a reactant gas such as tetraethoxysilane (TEOS). The thickness of the top $SiO_2$ layer 107c substantially ranges from 30 Å to 50 Å, and more specifically may be about 40 Å.

The composite layer 107 is then patterned to expose the portions of the first gate oxide layer 102 covering on the high voltage region 13a and the logic/analog region 12a to form the ONO structure 117. In some embodiments of the present disclosure, the composite layer can be patterned by photolithography and an anisotropic etching process, such as a RIE process or a plasma etching process (not shown). In the present embodiment, a portion of the ONO structure 107 extends over a portion of the first gate oxide layer 102 remaining on the memory region 11a.

Figure 1F:
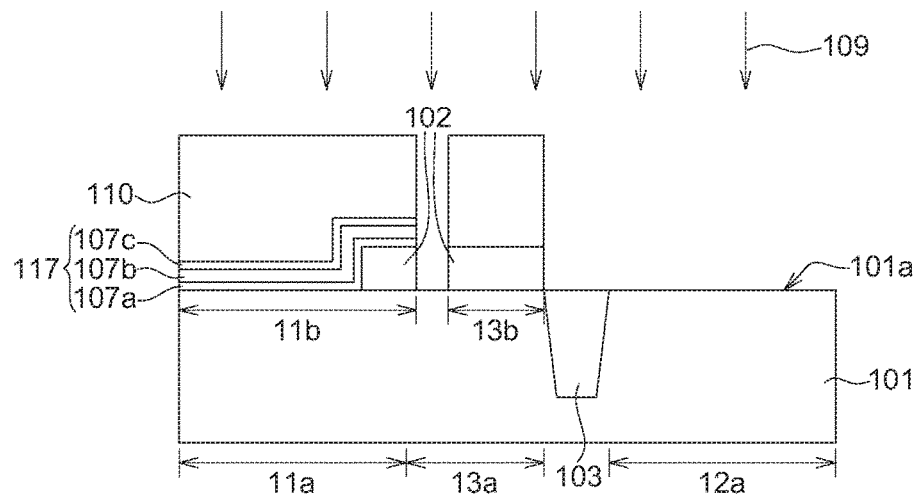

After the ONO structure 107 is formed, a second etching process 109 is then performed to at least remove the portion of the first gate oxide layer 102 covering on the logic/analog region 12a (see FIG. 1F). In some embodiments of the present disclosure, the second etching process 109 can be a wet etching process using solutions, such as hydrofluoric acid and water. In the present embodiment, the etching mask 110 (such as a patterned photoresist layer) of the second etching process 109 may not thoroughly cover on the high voltage region 13a, whereby the portion of the first gate oxide layer 102 disposed on the high voltage region 13a (but not covered by the etching mask 110) may be removed after the second etching process 109. In this case, the second channel area 13b that is defined by the remaining first gate oxide layer 102 disposed on the high voltage region 13a has a size substantiality smaller than that of the high voltage region 13a.

Figure 1G:
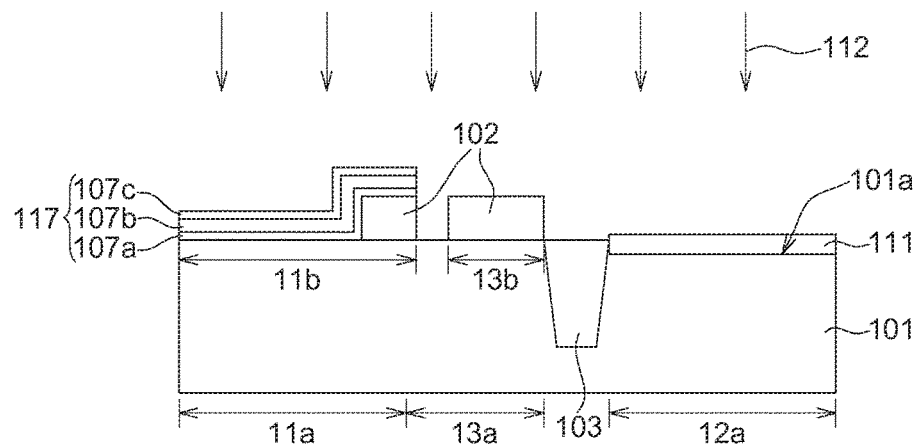

A second gate oxide layer 111 is then formed on the logic/analog region 12a to define at least one third channel area 12b (see FIG. 1G). In some embodiments of the present disclosure, the second gate oxide layer 111 can be formed by an ISSG oxidation process 112 or a silicon oxide deposition process (not shown) performed on the exposed surface 101a of the substrate 101 over the logic/analog region 12a. The first gate oxide layer 102 may has a thickness substantially greater than that of the second gate oxide layer 111. For example, in the present embodiment, the second gate oxide layer 111 may have a thickness substantially ranging from 50 Å to 70 Å, and more specifically may be about 60 Å. Since the first gate oxide layer 102 and the second gate oxide layer 111 are made by the same material, such as SiOx, thus the first gate oxide layer 102 has a dielectric constant substantially higher than that of the second gate oxide layer 111.

Of note that, the thicknesses of the top $SiO_2$ layer 107c and the storage $Si_3N_4$ layer 107b of the ONO structure 117 may vary during the processes for forming the second gate oxide layer 111. For example, a portion of the top $SiO_2$ layer 107c of the ONO structure 117 may be removed by the second etching process 109, and a portion of the storage $Si_3N_4$ layer 107b may be oxidized to form silicon oxide which can be regarded as a portion of the top $SiO_2$ layer 107c. In other words, the thickness of top $SiO_2$ layer 107c may be decreased during the second etching process 109 and then increased during the ISSG oxidation process 112. The thickness of the storage $Si_3N_4$ layer 107b may be decreased during the ISSG oxidation process 112.

Figure 1H:
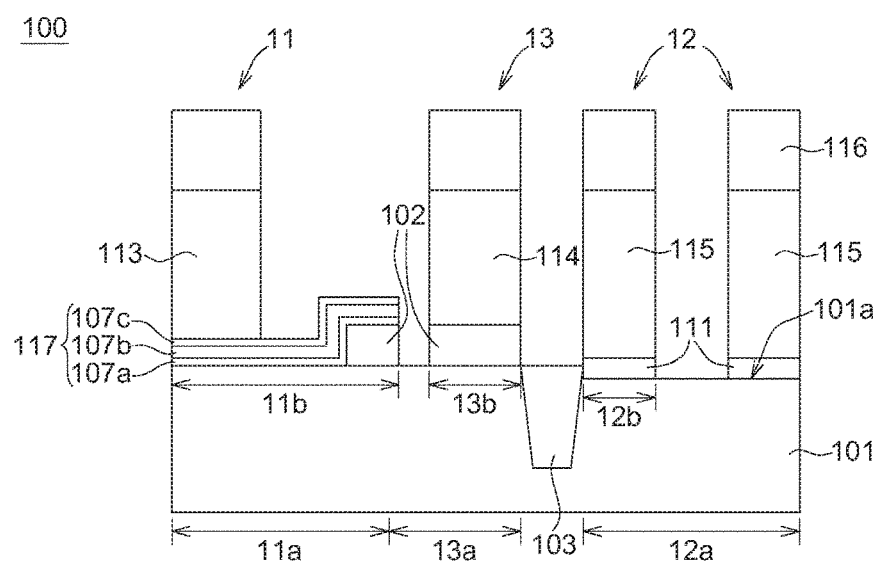

The second gate oxide layer 111 is then patterned by lithography and etching processes (not shown) to define at least one third channel area 12b on the logic/analog region 12a. Subsequently, a first gate 113, a second gate 114 and a third gate 115 a covered by hard mask 116 are respectively formed on the ONO structure 117, the portion of the first gate oxide layer 102 disposed on the high voltage region 13a and the second gate oxide layer 111, whereby a SONOS memory device 11, a high voltage device 13 and a logic/analog device 12, are respectively formed on the memory region 11a, the high voltage region 13a and the logic/analog region 12a. And after a series of back-end-of-line (BEOL) processes are performed, the process for forming the semiconductor IC 100 as shown FIG. 1H is accomplished.

According to one embodiment of the present disclosure, a first gate oxide layer is firstly formed on a substrate surface covering on a high voltage region, a memory region and a logic/analog region is firstly provided. Next, a first gate oxide layer is formed on the high voltage region. The first gate oxide layer is then patterned to respectively define a first channel area for forming SONOS memory device on the memory region and a second channel area for forming a high voltage device on the high voltage region. Subsequently, an ONO structure is formed on the first channel area and a second gate oxide layer is formed on the logic/analog region to define a third channel area for forming a logic/analog device.

Since the first gate oxide layer for forming the high voltage device requires a dielectric constant substantially higher than that of the second gate oxide layer for forming a logic/analog device, thus the thickness of the first gate oxide layer and the thermal budget for forming the same may greater than that of the second gate oxide. By adjusting the processing sequences for fabricating the semiconductor IC to make the first gate oxide layer formed before the ONO structure of the SONOS memory device and the second gate oxide layer, the ONO structure can be prevented from being inversely affected by thermal impact resulted from the process for forming the first gate oxide layer which could deteriorate the electric performance of the SONOS memory device by reducing the top oxide layer thickness and processing window of the ONO structure. Such that the process yields and the performance of the semiconductor IC can be improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a merging semiconductor integrated circuit (IC) having a silicon/silicon oxide/silicon nitride/silicon oxide/silicon (SONOS) memory device and a logic/analog device requiring different gate oxide layers, comprising:
    providing a substrate having a high voltage region, a memory region and a logic/analog region;
    forming a first gate oxide layer on the high voltage region, the memory region and the logic/analog region;
    forming a hard mask layer on the first gate oxide layer;
    performing an ion implantation to drive a plurality of dopants into the logic/analog region;
    patterning the first gate oxide layer to expose the logic/analog region and to define a first channel area and a second channel area respectively on the memory region and the high voltage region, after forming the hard mask layer and performing the ion implantation;
    forming a silicon oxide-silicon nitride-silicon oxide (ONO) structure on the first channel area; and
    forming a second gate oxide layer on the logic/analog region to define a third channel area.

2. The method according to claim 1, wherein the patterning of the first gate oxide layer comprises:
    performing a first etching process to remove a portion of the first gate oxide layer disposed on the memory region, prior to the forming of the ONO structure; and
    performing a second etching process to remove portions of the first gate oxide layer disposed on the high voltage region and the logic/analog, after the forming of the ONO structure.

3. The method according to claim 2, wherein a portion of the ONO structure extends over a portion of the first gate oxide layer remaining on the memory region.

4. The method according to claim 2, wherein the ONO structure comprises a first silicon oxide layer, a silicon nitride layer and a second silicon oxide layer stacked on the memory region in a sequence, and a portion of the second silicon oxide layer is removed by the second etching process.

5. The method according to claim 1, further comprising steps of removing a portion of the hard mask layer disposed on the logic/analog region prior to the ion implantation.

6. The method according to claim 1, wherein the providing of the substrate comprises forming at least one shallow trench isolation in a semiconductor substrate to define the high voltage region, the memory region and the logic/analog.

7. The method according to claim 1, further comprising steps of forming a first gate, a second gate and a third gate respectively on the ONO structure, a portion of the first gate oxide layer disposed on the high voltage region and the second gate oxide layer.

8. The method according to claim 1, wherein the first gate oxide layer has a thickness substantially greater than that of the second gate oxide layer.

9. The method according to claim 1, wherein the first gate oxide layer has a dielectric constant substantially higher than that of the second gate oxide layer.

* * * * *